United States Patent [19]

Furuyama et al.

[11] Patent Number: 4,733,374
[45] Date of Patent: Mar. 22, 1988

[54] DYNAMIC SEMICONDUCTOR MEMORY DEVICE

[75] Inventors: Tohru Furuyama, Tokyo; Shigeyoshi Watanabe, Yokohama; Tatsuo Ikawa, Tokyo, all of Japan

[73] Assignee: Kabushiki Kaisha Toshiba, Kawasaki, Japan

[21] Appl. No.: 844,626

[22] Filed: Mar. 27, 1986

[30] Foreign Application Priority Data

Mar. 30, 1985 [JP] Japan .................................. 60-66757
Sep. 3, 1985 [JP] Japan ................................ 60-194695

[51] Int. Cl.$^4$ .............................................. G11C 7/00
[52] U.S. Cl. .................................. 365/205; 365/149; 365/208
[58] Field of Search ............... 365/149, 189, 205, 207, 365/208; 357/45, 41

[56] References Cited

U.S. PATENT DOCUMENTS 4,025,907  5/1977  Karp et al. ........................... 365/149
4,045,783  8/1977  Harland ................................ 365/149
4,476,547  10/1984 Miyasaka ............................. 365/205

OTHER PUBLICATIONS

Japanese Patent Publication (Kokoku) No. 55-39073, Oct. 8, 1980.
Furuyama et al., "A Vertical Capacitor Cell for ULSI DRAM's," Symposium on VLSI Technology, pp. 16–17, Sep. 1984.
Wada et al., "A Folded Capacitor Cell (F.C.C.) for Future Megabit DRAMs," IEDM Technical Digest, pp. 244, 247, 1984.

Primary Examiner—Joseph A. Popek
Attorney, Agent, or Firm—Finnegan, Henderson, Farabow, Garrett & Dunner

[57] ABSTRACT

A semiconductor memory device has N sense amplifiers each having first and second input terminals, N first memory cells, N second memory cells, N first bit lines each of which is connected to the first memory cells of the same column and connected to the first input terminal of one of the sense amplifiers, and N second bit lines each of which is connected to the second memory cells of the same column and connected to the second input terminal of one of the sense amplifiers. The first memory cells are formed in a first memory cell area and the second memory cells are formed in a second memory cell area arranged adjacent to the first memory cell area and on the same side as the first memory cell area with respect to the sense amplifiers.

10 Claims, 22 Drawing Figures

DYNAMIC SEMICONDUCTOR MEMORY DEVICE

BACKGROUND OF THE INVENTION

The present invention relates to a dynamic semiconductor memory device which can be integrated at a high density.

In the one-transistor memory cell which is formed of one MOS transistor and one capacitor, the memory cell occupies a small area. Therefore, this type of memory cell is advantageously used in the case of manufacturing semiconductor memories with a high density or high integration. For example, it is frequently used to form a dynamic random access memory (DRAM). Recently, the studies have been made to reduce the area occupied by the capacitor of the one-transistor memory cell and design the proper structure of this memory cell for high density. As such a kind of memory cell, vertical capacitor cell, folded capacitor cell, and corrugated capacitor cell have been known. For example, the vertical capacitor cell has been published in, T. Furuyama and J. Frey, "A VERTICAL CAPACITOR CELL FOR VLSI DRAM'S", Symposium on VLSI Technology, *Technical Digest*, 1984, page 16. The folded capacitor cell has been introduced in, Wada et al, "A Folded Capacitor Cell For Future Megabit DRAMs", *IDEM*, 1984. The corrugated capacitor cell has been published in International Solid State Circuit Conference (ISSCC) in 1984. This corrugated capacitor cell is constituted such that a narrow groove is formed perpendicularly to the wafer in the central portion of the capacitor region and the charges are stored in the capacitor formed of opposite side surfaces of this groove, thereby increasing an amount of signal charges which can be stored in the capacitor. On the other hand, the vertical capacitor cell is constituted such that a groove is formed in the wafer at the position corresponding to the element isolation region and an insulation region is formed in the bottom portion of this groove to isolate the opposing side walls from each other and the charges are stored in the capacitor formed using one of the opposing side walls.

The vertical capacitor cell, folded capacitor cell, and corrugated capacitor cell have capacitors of large capacitances in small occupied areas, so that they are fitted for high integration.

Figure 1A:
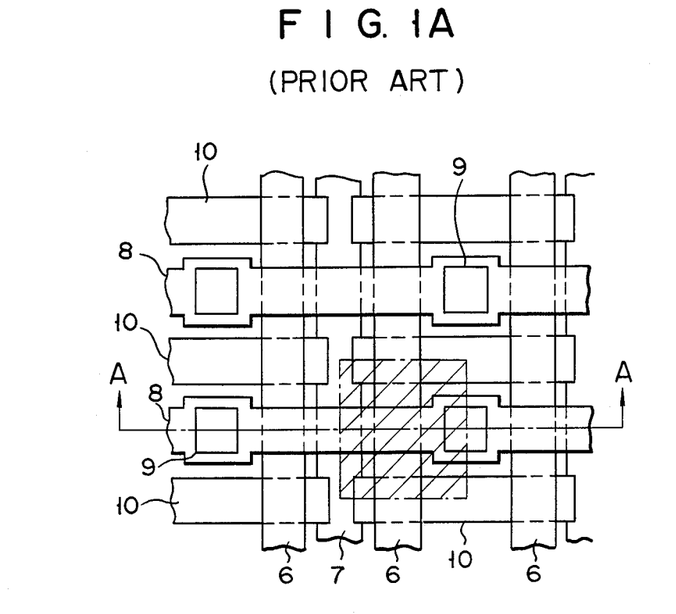
FIGS. 1A and 1B diagrammatically show a plane pattern and a cross sectional view of part of a conventional memory device including vertical capacitor cells.
Figure 1B:
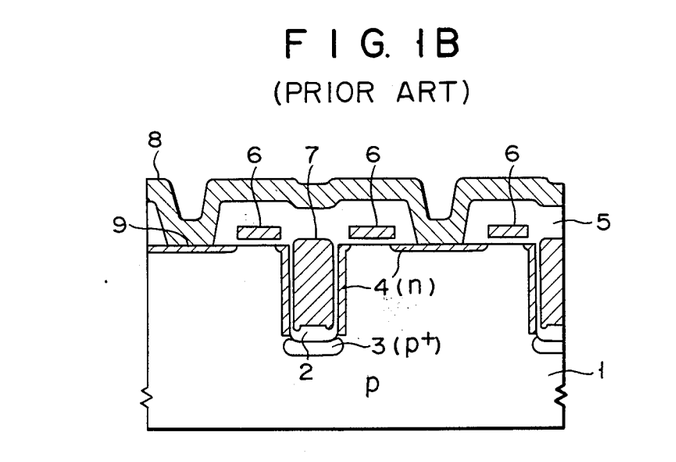

FIG. 1A diagrammatically shows a plane pattern of part of a conventional memory having vertical capacitors. FIG. 1B shows a cross sectional structure which is derived by cutting away part of the memory shown in FIG. 1A along the A—A line. This memory includes p-type semiconductor substrate 1; groove 2 formed in substrate 1; p$^+$-type element isolation region 3 formed in the bottom portion of groove 2 by ion implantation; n-type semiconductor region 4 formed in part of the surface of substrate 1 and side wall of groove 2; insulation layer 5 formed on substrate 1; and word lines 6 which are formed in insulation layer 5 and also serve as MOS transistor gate electrodes. Word lines 6 are formed of polycrystalline silicon, silicide, polycide, refractory metal such as molybdenum, or the like. In addition, polycrystalline silicon layer 7 is formed in groove 2 and constitutes a capacitor in cooperation with n-type region 4 formed in the side wall of groove 2. Bit line 8 is formed on insulation layer 5 in a direction perpendicular to word lines 6. Part of bit lines 8 are connected to the portions serving as one end (drain) of the MOS transistor in n-type semiconductor region 4 by contact areas 9. Silicide, polycide, refractory metal, aluminum, or the like is used as a material of bit line 8. Element isolation region 10 is formed by embedded silicon dioxide. In FIG. 1A, the hatched region surrounded by dot-and-dash line denotes one memory cell region.

As will be understood from FIGS. 1A and 1B, the vertical capacitor cell has conventionally been handled as a memory cell whose plane pattern and structure are fitted to constitute a memory of open bit line structure. The open bit line structure means that a pair of bit lines are arranged to extend in the opposite directions with a sense amplifier connected between them.

Figure 2A:
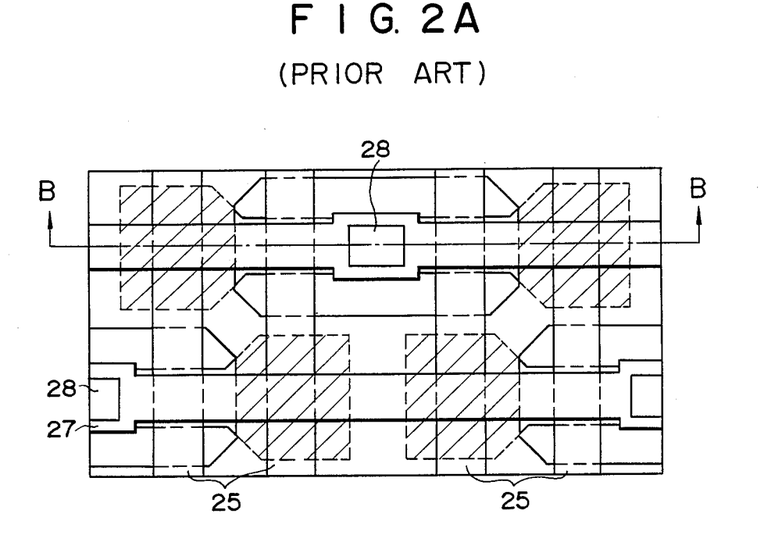
FIGS. 2A and 2B show a diagrammatical plane pattern and a cross sectional structure of a conventional memory device including memory cells suitable for the folded bit line structure.
Figure 2B:
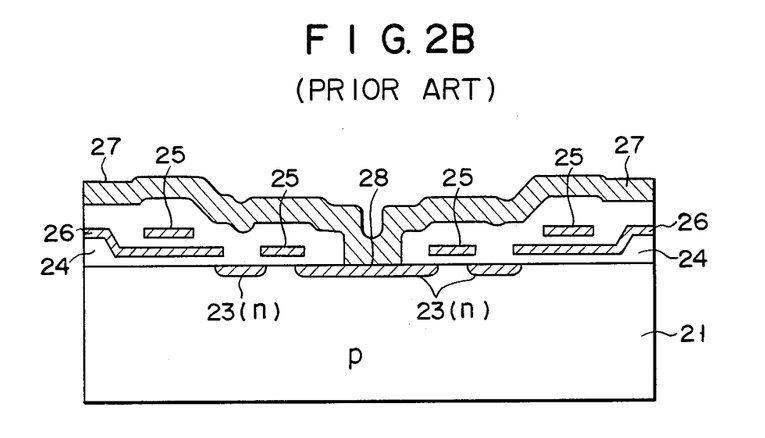

On the other hand, there is a memory structure called folded bit line structure. The folded bit line structure denotes that a pair of bit lines are arranged adjacently or closely in parallel with each other and connected at one end to a sense amplifier. FIG. 2A shows a plane pattern of the memory region including, for example, four memory cells which are suitable for the folded bit line structure and are frequently used in the dynamic RAM which is at present commercially available. FIG. 2B shows a cross sectional structure taken along the B—B line of FIG. 2A. This memory includes p-type semiconductor substrate 21; n-type semiconductor regions 23 formed in the surface area of substrate 21; insulation layer 24 formed on the substrate surface; word lines 25 which are formed in insulation layer 24 and also serve as MOS transistor gate electrodes; capacitor electrodes 26 formed in insulation layer 24; and bit lines 27 formed on insulation layer 24 in a direction perpendicular to word lines 25. Part of bit lines 27 are connected to the portions serving as one end of the MOS transistor in n-type semiconductor region 23 by contact areas 28. In addition, in the capacitor regions of the hatched portions in FIG. 2A, capacitor electrode 26 constitutes a capacitor in cooperation with an n-type region (not shown) formed in the surface area of substrate 21. As will be understood from FIGS. 2A and 2B, to realize the conventional folded bit line structure, two word lines 25 per memory cell must be arranged in the lateral direction in the same layer and wired. In this respect, it is considered improper to use, in the memory of the folded bit line structure, the vertical capacitor cell in which the memory cell pitch is small in the direction of bit line.

Figure 3A:
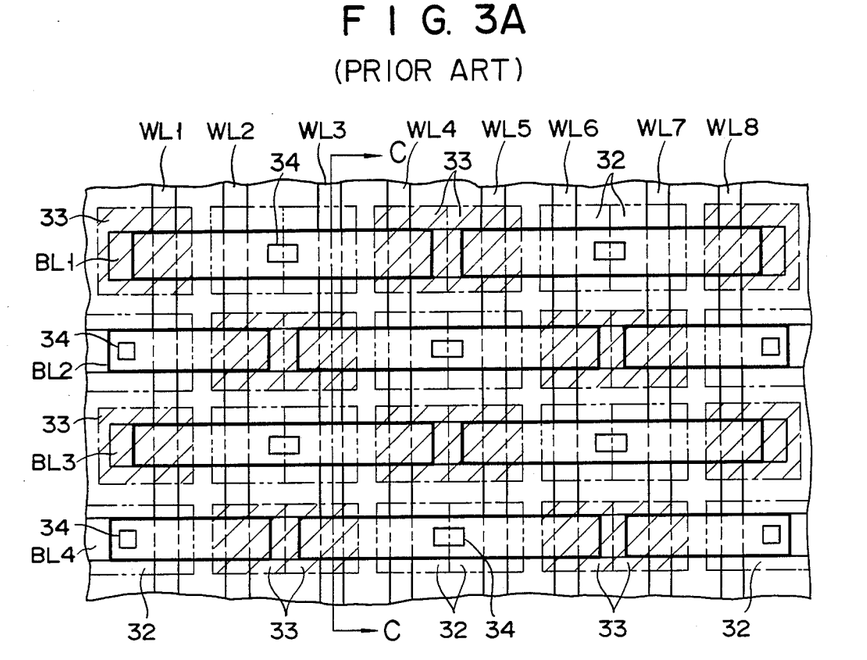
FIGS. 3A and 3B diagrammatically show a plane pattern and a cross sectional structure of a conventional memory device including folded capacitor cells.
Figure 3B:
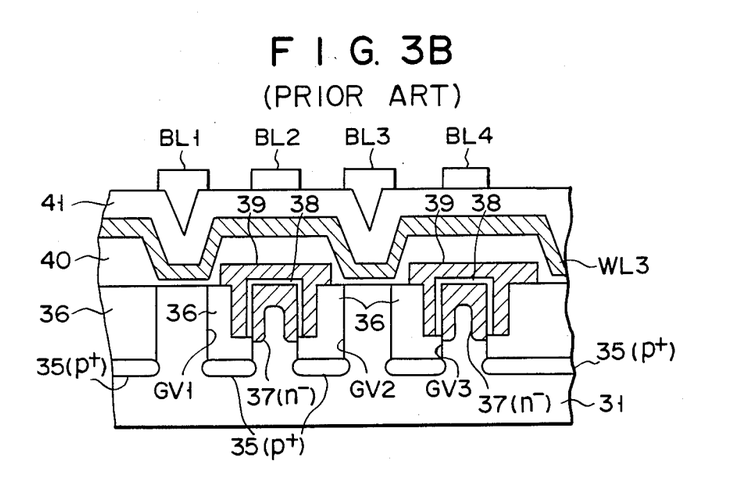

FIG. 3A shows a plane pattern of part of a DRAM having folded capacitor cells. FIG. 3B shows a cross sectional structure taken along the C—C line of FIG. 3A.

This DRAM is constituted such that word lines WL$_1$, WL$_2$, ..., WL$_8$ are arranged in a vertical direction on a semiconductor substrate 31 formed of, e.g., p-type silicon, and bit lines BL$_1$ to BL$_4$ are arranged in a horizontal direction over those word lines. MOS transistors formed in regions 32 surrounded by dash-and-two-dot lines or MOS capacitors formed in hatched regions 33 surrounded by dash-and-dot lines are arranged at the positions corresponding to the crossing points of word lines WL$_1$ to WL$_8$ and bit lines BL$_1$ to BL$_4$. The source region of the MOS transistor is connected to the MOS capacitor which is formed adjacent the MOS transistor in the data line direction. The drain region of the MOS transistor is connected to one of bit lines BL$_1$ to BL$_4$ through contact hole 34.

In addition, as clearly shown in FIG. 3B, grooves GV$_1$ to GV$_3$ are each formed in the memory cell isolation region between adjacent two of bit lines BL$_1$ to BL$_4$ formed over semiconductor substrate 31. p$^+$-type impurity region 35 are formed in the bottom surfaces of grooves GV$_1$ to GV$_3$. Oxide layers 36 are deposited on grooves GV$_1$ to GV$_3$. Due to grooves GV$_1$ to GV$_3$, the memory cell regions surrounded by thick solid lines in FIG. 3A become relatively convex as compared with the other regions. In capacitor region 33, n⁻ type impurity region 37 is formed on the top and side surfaces of the convex portion of semiconductor substrate 31. Capacitor electrode 39 of polycrystalline silicon is formed through oxide layer 38 over n⁻ type impurity region 37 formed on the top and side surfaces of the convex portion, thereby constituting the MOS capacitor.

Figure 4A:
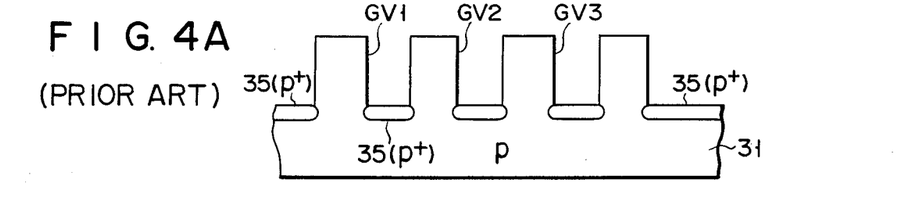
FIGS. 4A to 4D are explanatory diagrams of the manufacturing steps of the memory device shown in FIGS. 3A and 3B.

A method of manufacturing the DRAM shown in FIGS. 3A and 3B will then be described with reference to FIGS. 4A to 4D. Grooves $GV_1$ to $GV_3$ are formed in semiconductor substrate 31 of p-type silicon having a resistance of about 10 Ω-cm by a reactive ion etching method as shown in FIG. 4A. B ions are implanted into the bottom surfaces of grooves $GV_1$ to $GV_3$ by ion implantation, thereby forming p⁺-type impurity regions 35.

Figure 4B:
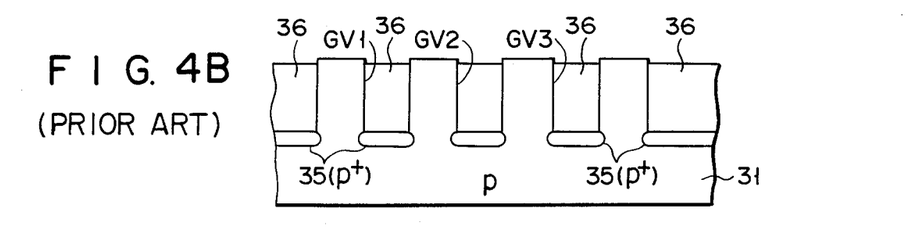

Next, oxide layer 36 is deposited on the whole surface to completely cover the grooves. Thereafter, oxide film 36 is etched to expose the top surfaces of the convex regions of semiconductor substrate 31 sandwiched by grooves $GV_1$ to $GV_3$ as shown in FIG. 4B.

Figure 4C:
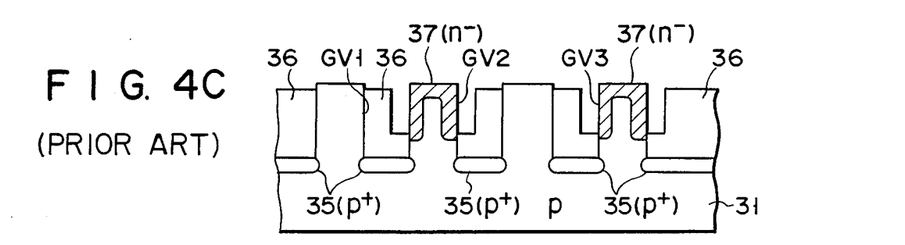
Figure 4D:
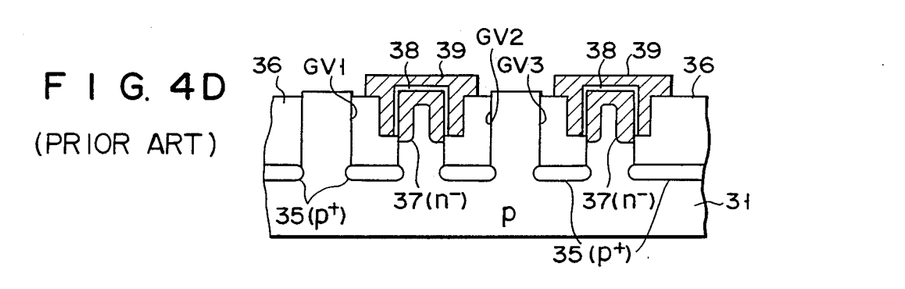

Then, capacitor regions 33 are patterned by a photo etching process (PEP) and only oxide layers 36 in grooves $GV_1$ to $GV_3$ in capacitor regions 33 are selectively removed by a reactive ion etching method as shown in FIG. 4C. In this manner, the top and side surfaces of the convex regions of semiconductor substrate 31 in capacitor regions 33 are exposed. As ions are implanted into the top and side surfaces of the exposed convex portions due to ion implantation to form n⁻-type impurity regions 37. Subsequently, as shown in FIG. 4D, oxide films 38 are formed on the surface of n⁻-type impurity regions 37 by thermal oxidation. Further, capacitor electrodes 39 of polycrystalline silicon are formed on oxide layers 38. As described above, the MOS capacitor part of which was embedded in the groove is formed in capacitor region 33.

Further, an insulation layer 40 is formed on capacitor electrode 39. A gate oxide layer is formed on the convex region of the memory cell region excluding capacitor region 33. Word lines $WL_1$ to $WL_8$ of polycrystalline silicon are formed on insulation layers 40 and gate oxide layers. The source and drain regions are formed in memory cell regions 32 by ion implantation, thereby forming the MOS transistors. An insulation layer 41 between layers is further formed on the whole surface and contact holes 34 are formed at predetermined positions. Thereafter, bit lines $BL_1$ to $BL_4$ of aluminum are formed. Thus, the DRAM shown in FIGS. 3A and 3B are obtained.

Figure 5:
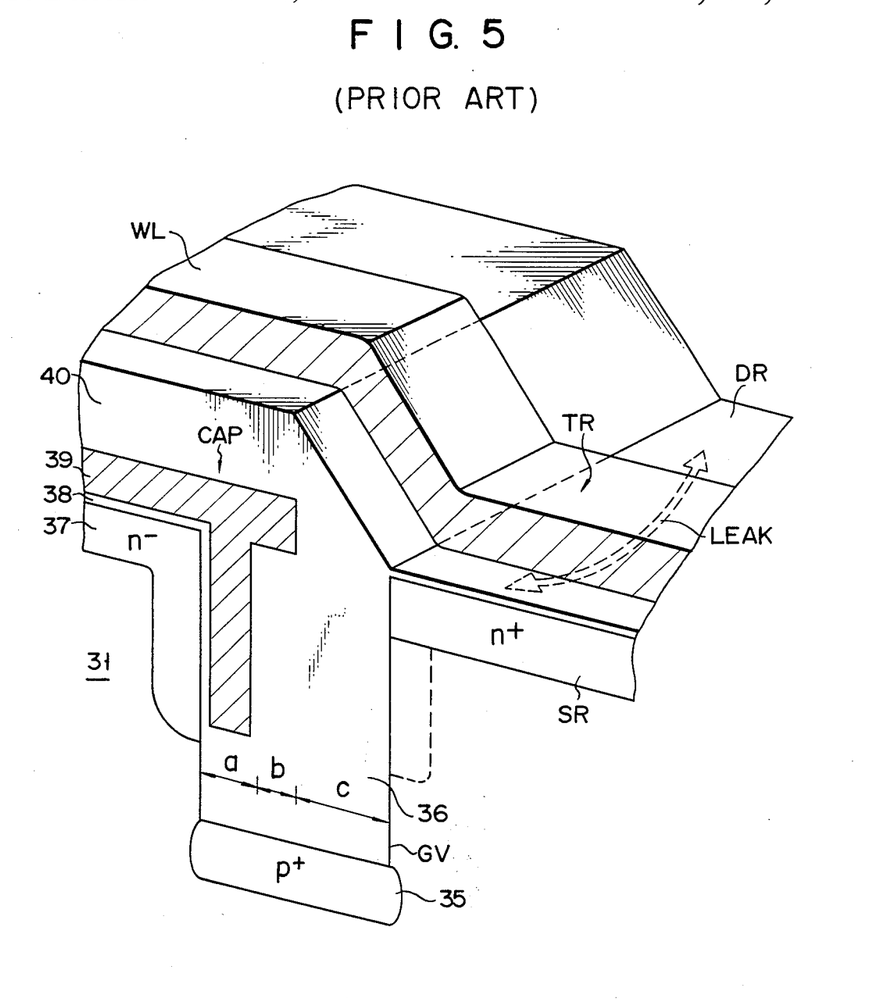
FIG. 5 shows in detail a structure of a part of the memory device shown in FIGS. 3A and 3B.

FIG. 5 shows a perspective view of the DRAM of FIGS. 3A and 3B including a partial cross section of one memory cell. The width of groove GV formed in semiconductor substrate 31 is equal to the sum of a thickness a of capacitor electrode 39 embedded in groove GV, a length b of the extended portion formed on oxide layer 36 deposited in groove GV, and an interval c between capacitor electrode 39 and memory cell region 32 where a MOS transistor TR is formed. Now, in the case of manufacturing the DRAM using a rule of 0.8 μm, a=0.4 μm b=0.3 μm c=0.3 μm are respectively necessary, so that the width (a+b+c) of groove GV becomes 1.0 μm. In this case, a thickness (b+c) of oxide layer 36 between capacitor electrode 39 embedded in groove GV and memory cell region 32 where MOS transistor TR is formed becomes 0.6 μm.

However, the thickness of about 0.6 μm of oxide layer 36 causes the phenomenon that a side surface portion B which is in contact with groove GV of memory cell region 32 is inverted due to the potential of capacitor electrode 39. In other words, a parasitic transistor is formed, in which capacitor electrode 39 in groove GV serves as a gate electrode, oxide layer 36 in groove GV serves as a gate oxide layer, and source and drain regions (SR and DR) of MOS transistor TR in the memory cell region respectively serve as source and drain regions. Due to conduction of this parasitic transistor, a leak path is formed between the source and drain of MOS transistor TR and the data in the memory cell is broken.

To prevent formation of the leak path due to the parasitic transistor, it is necessary to set the thickness (b+c) of oxide layer 36 serving as the gate oxide layer to a value of 1.2 μm or more. In this case, the width (a+b+c) of groove GV becomes 1.6 μm or more, resulting in an increase in thickness of at least 0.6 μm. When now considering the DRAM of 4 kbits having 2048×2048 memory cells, the whole chip width is increased by about 1.2 mm (=0.6 μm×2048).

As described above, the DRAM in which part of memory capacitor CAP is embedded in the groove formed in the semiconductor substrate has the problem that the chip area is increased in order to prevent occurrence of the leak path due to the parasitic transistor. Moreover, the increase in the chip area is proportional to integration degree of the DRAM, so that it becomes a critical problem with an increase in integration.

In general, the memory of the folded bit line structure is constituted such that a pair of bit lines are adjacently arranged in parallel with each other; therefore, it has the advantage that noise generated due to unbalance in capacitances between the bit lines or various kinds of factors associated with the bit lines are remarkably reduced as compared with that generated in the memory of the open bit line structure. Further, a pitch corresponding to two memory cells can be ordinarily set as the pitch of sense amplifiers in the direction substantially perpendicular to the bit line, so that a pattern can be easily designed. Therefore, it is demanded to arrange the folded capacitor cell, vertical capacitor cell, and corrugated capacitor cell to have the folded bit line structure. However, actually, there are various kinds of problems as described above in the case of arranging these kinds of memory cells in the folded bit line structure.

It is an object of the present invention to provide a dynamic semiconductor memory device which is constituted by arranging memory cells suitable for high integration in the folded bit line structure.

This object is accomplished by a dynamic semiconductor memory device comprising a plurality of memory cells formed in a first memory cell area; sense amplifiers which are each formed in a sense area to generate an output signal responsive to input signals which are supplied to first and second input terminals thereof; a plurality of memory cells formed in a second memory cell area formed on the same side as the first memory cell area with respect to the sense area; a plurality of bit lines each of which is commonly connected to the memory cells on the same column in the first memory cell area and connected to the first input terminal of corresponding one of the sense amplifiers, and a plurality of bit lines each of which is commonly connected to the memory cells on the same column in the second memory cell area and connected to the second input terminal of corresponding one of the sense amplifiers.

DETAILED DESCRIPTION OF THE PREFERRED EMBODIMENTS

Figure 6A:
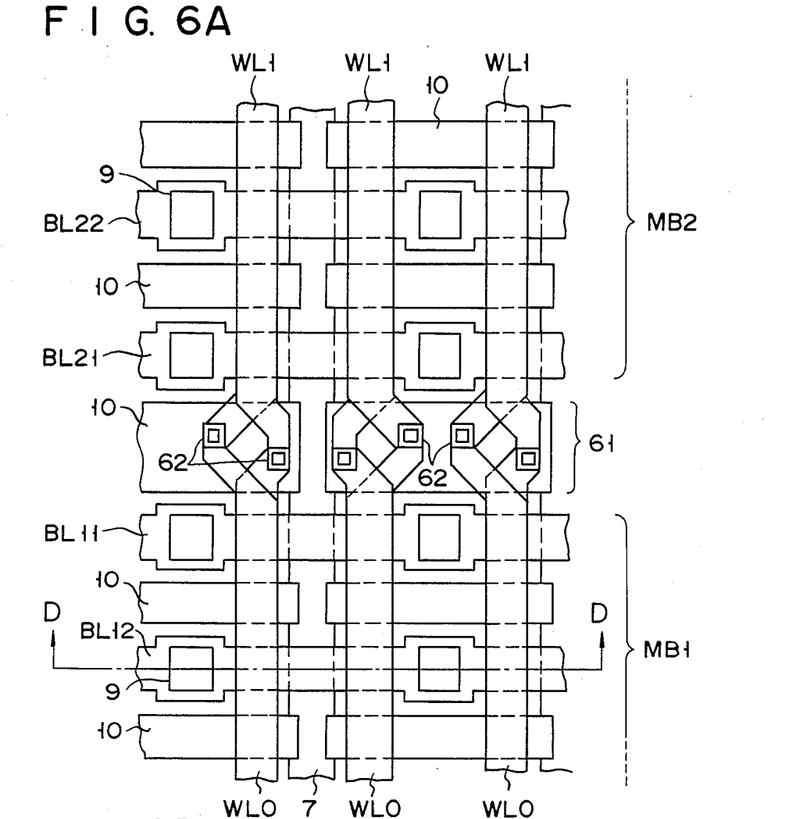
FIGS. 6A and 6B show a diagrammatical plane pattern and a cross sectional structure of a memory device including vertical capacitor cells according to an embodiment of the present invention.
Figure 6B:
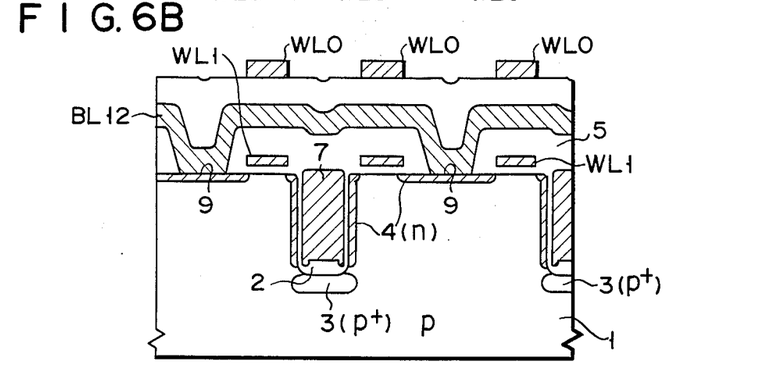
Figure 7:
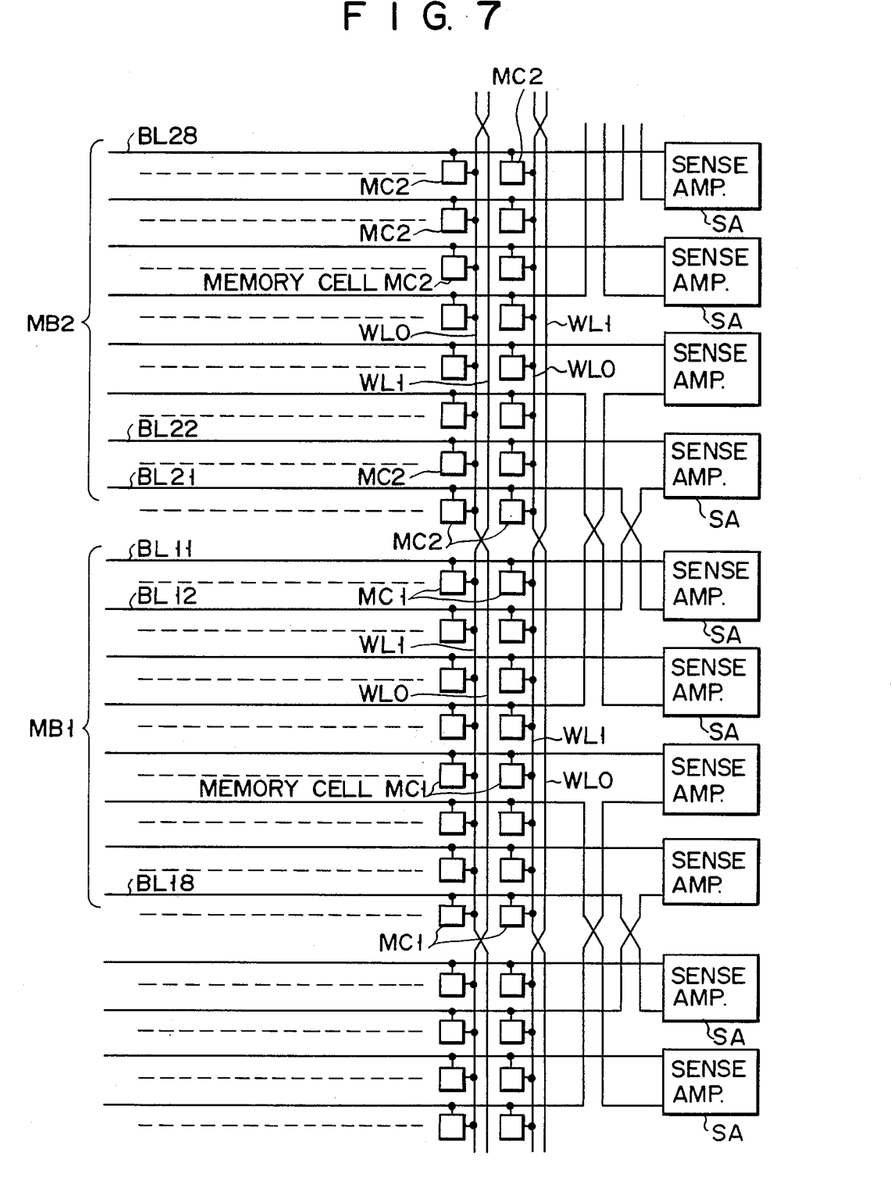
FIGS. 7 and 8 show positional and connection relations between the memory cells in the memory device shown in FIGS. 6A and 6B and the sense amplifiers of the bit lines.
Figure 8:
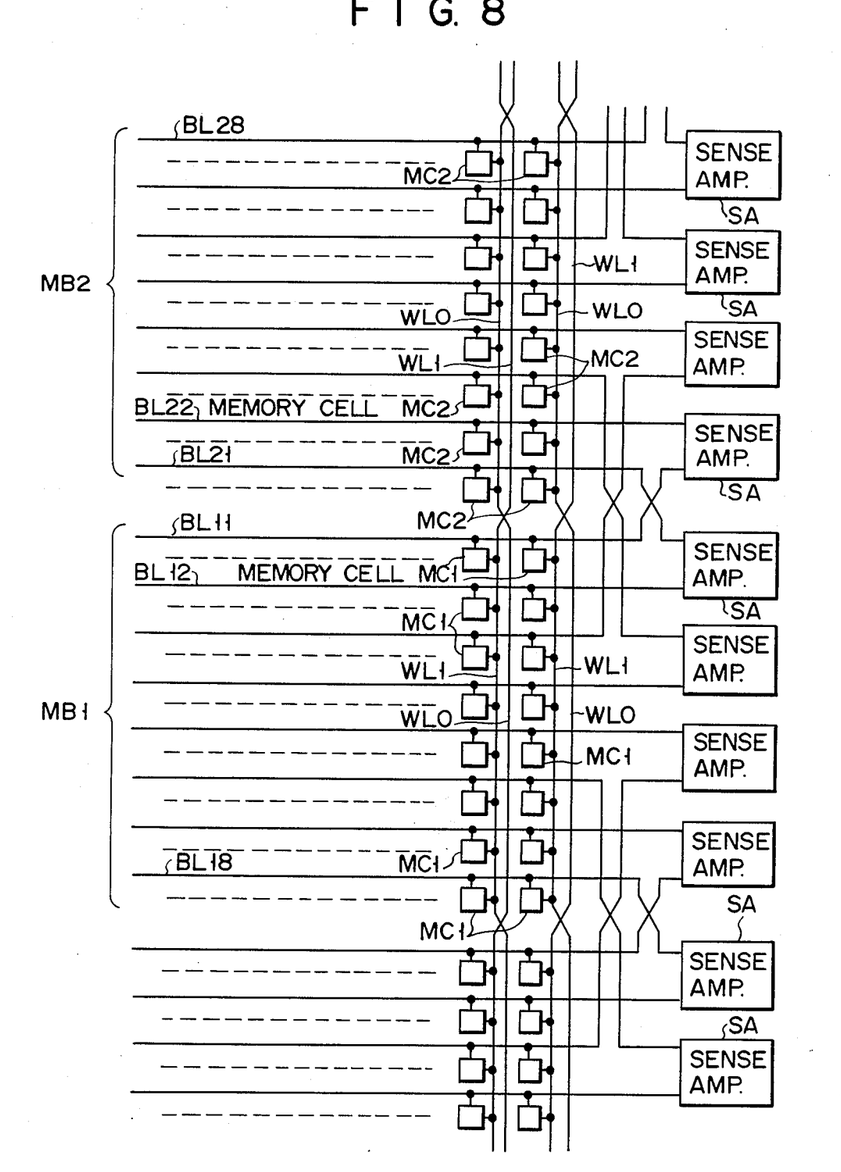

FIG. 6A shows a plane pattern of part of a memory cell array in a dynamic RAM according to an embodiment of the present invention. FIG. 6B diagrammatically shows a cross sectional structure taken along the D—D line in FIG. 6A. FIGS. 7 and 8 show an example of circuit connection in the memory cell array shown in FIGS. 6A and 6B. This dynamic RAM is constituted such that, for example, the foregoing vertical capacitor cells are arranged in a matrix form and the folded bit line structure is realized. Namely, the RAM shown in FIGS. 6A and 6B differs from the RAM shown in FIGS. 1A and 1B with respect to the following points. (1) A pair of two word lines are formed in two-layer structure at the pitch of one memory cell by different steps in the manufacturing process (for example, two word lines $WL_1$ and $WL_0$ are formed below and above bit line BL12). (2) Region 61 for exchanging upper and lower word lines is provided between the adjacent two of the memory cell blocks each including eight memory cells in the direction of the word line. The upper and lower word lines in a certain memory cell block are respectively connected to the corresponding lower and upper word lines in the adjacent memory cell block by contact hole areas 62 which are separately formed in exchanging region 61. (3) In each memory cell block, the lower word lines are connected to the MOS transistor of each memory cell and the upper word lines are used only for wiring. The other portions are substantially similar to those of the RAM shown in FIGS. 1A and 1B and the same parts and elements as those in FIGS. 1A and 1B are designated by the same reference numerals and their descriptions are omitted.

In the RAM shown in FIGS. 6A and 6B, the adjacent memory cell blocks are not selected by the same word line. Therefore, a pair of bit lines can be constituted by one bit line in a certain memory cell block and one bit line in the adjacent memory cell block. Two bit lines of the bit line pair constituted in this manner are connected to the same sense amplifier as shown in FIGS. 7 and 8. For instance, in FIG. 6A and FIG. 7 or 8, bit lines $BL_{11}$ to $BL_{18}$ are connected to memory cells $MC_1$ which are selectively energized by lower word lines $WL_1$ in a memory cell block $MB_1$. Similarly, bit lines $BL_{21}$ to $BL_{28}$ are connected to memory cells $MC_2$ which are selectively energized by lower word lines $WL_0$ in an adjacent memory cell block $MB_2$. A pair of bit lines can be constituted by one of bit lines $BL_{11}$ to $BL_{18}$ in memory cell block $MB_1$ and one of bit lines $BL_{21}$ to $BL_{28}$ in memory cell block $MB_2$ and are connected to one of sense amplifiers. For example, by connecting a pair of bit lines $BL_{11}$ and $BL_{21}$ to one of sense amplifiers SA and connecting a pair of bit lines $BL_{12}$ and $BL_{22}$ to another sense amplifier SA, the folded bit line structure can be realized as the circuit shown in FIG. 7. Alternatively, by connecting a pair of bit lines $BL_{11}$ and $BL_{22}$ and a pair of bit lines $BL_{12}$ and $BL_{21}$ to different sense amplifiers SA, respectively, the folded bit line structure can be realized as the circuit shown in FIG. 8.

Silicide, polycide, refractory metal, aluminum which is used to form bit line 8, may be used as a material of the upper word lines. It is not always necessary to form the gate electrode of the transistor in the memory cell by the lower word line. The gate electrode of the memory cell transistor and the lower word line may be separately formed and they may be connected by the contact hole area. Namely, it is sufficient to electrically connect the gate electrode of the memory cell transistor with the lower word line. In addition, although the upper word line is formed above the bit line in the embodiment, the relations between their vertical positions may be reversed.

In the dynamic memory in this embodiment, two word lines are wired at the pitch of one memory cell to realize the folded bit line structure. These two word lines are not formed in the same layer but formed in the two-layer structure by different steps in the manufacturing process. The lower word line forms the gate electrode of the memory cell or is connected to this gate electrode and the upper word line is used as the mere wiring. By exchanging the vertical positions of first and second word lines for every proper number (e.g., eight) of memory cells in the direction along the word lines, the memory cells of the same row in every other memory cell blocks including memory cell block $MB_1$ can be selected by the first word line, for example. In this case, the memory cells of the same row in remaining memory cell blocks including memory cell block MB$_2$ can be selected by the second word line. Due to this, each pair of bit lines are separately selected from the memory cell blocks which are respectively energized by the first and second word lines and connected to a corresponding one of the sense amplifiers, thereby realizing the folded bit line structure. In the embodiment, the RAM using the vertical capacitor cell having a small area and a large capacitance and fitted for high integration has been explained. However, the folded bit line structure can be also realized in the case of the RAM using the corrugated capacitor cell in accordance with the embodiment.

Figure 9:
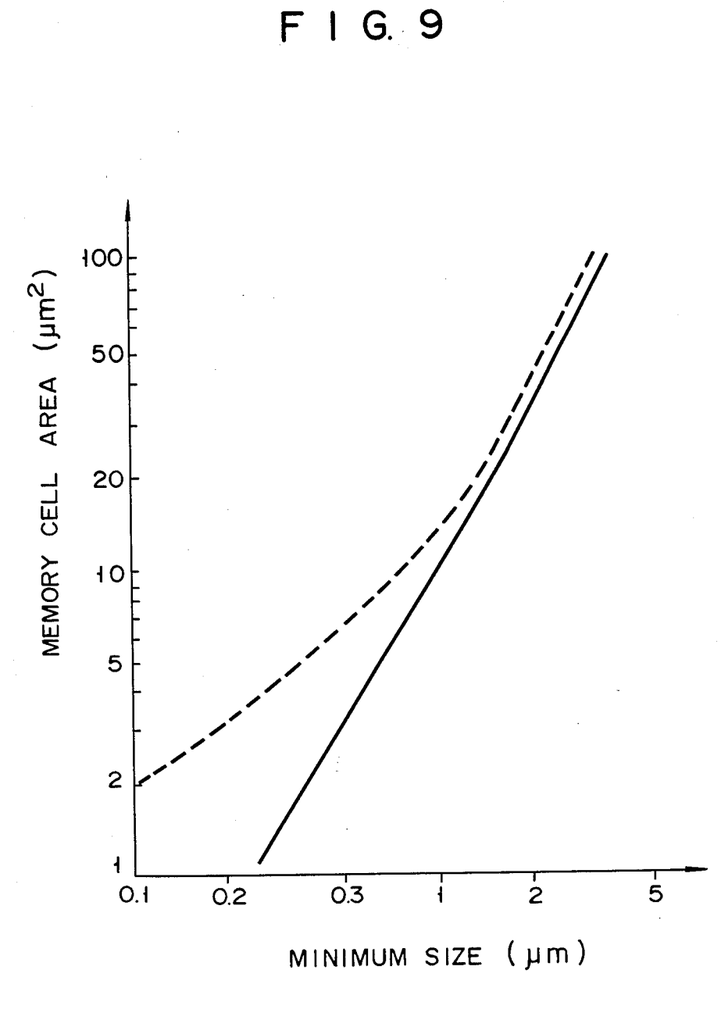
FIG. 9 is a graph showing the ratio of the occupied areas between the conventional vertical capacitor cell and the vertical capacitor cell according to the embodiment of the invention shown in FIGS. 6A and 6B.

FIG. 9 shows the relation between the occupied area of the memory cell having a capacitor of a predetermined capacitance and the minimum size of designed pattern for comparing the sizes of the conventional memory cell as shown in FIGS. 2A and 2B and the vertical capacitor cell of the embodiment. As will be understood from FIG. 9, the occupied area of the vertical capacitor cell shown by the solid line can be remarkably reduced as compared with the change in the occupied area of the conventional memory cell indicated by the broken line in the case where the minimum size is smaller than 1 $\mu$m, so that the vertical capacitor cells are fitted to realize high density.

Figure 10A:
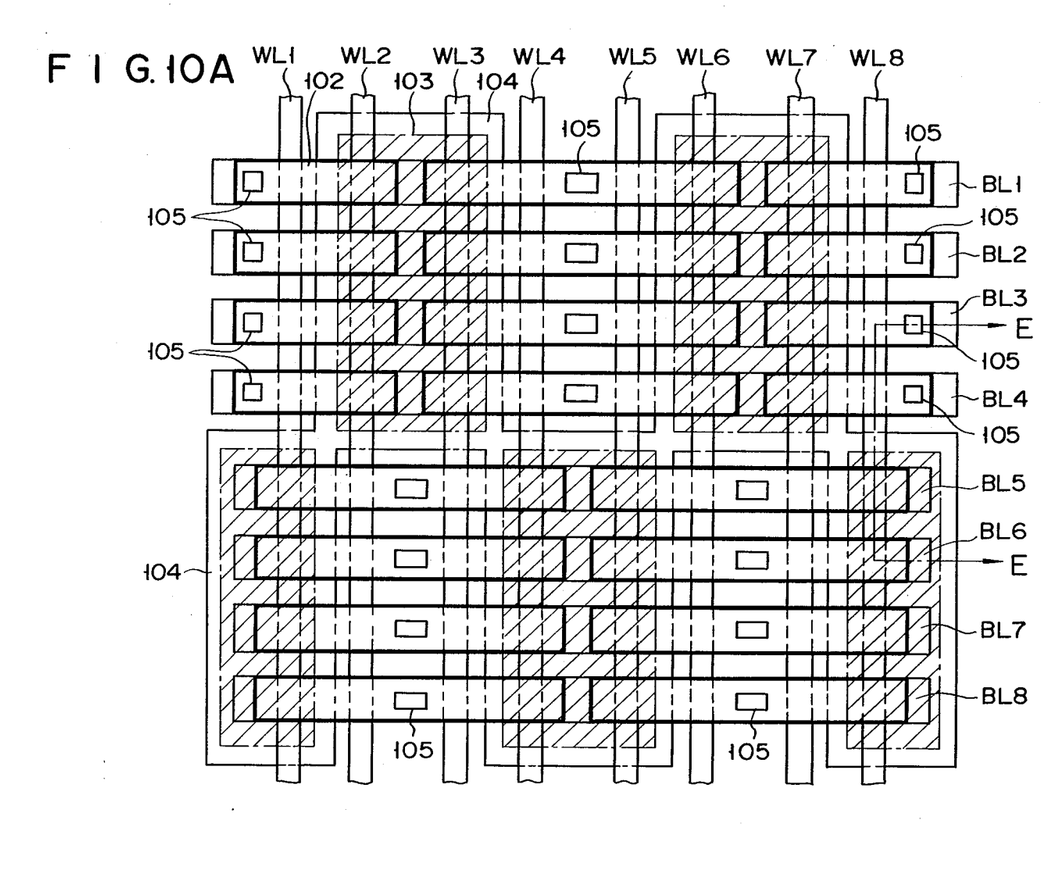
FIGS. 10A and 10B diagrammatically show a plane pattern and a cross sectional view of a memory device having folded memory cells according to another embodiment of the invention.
Figure 10B:
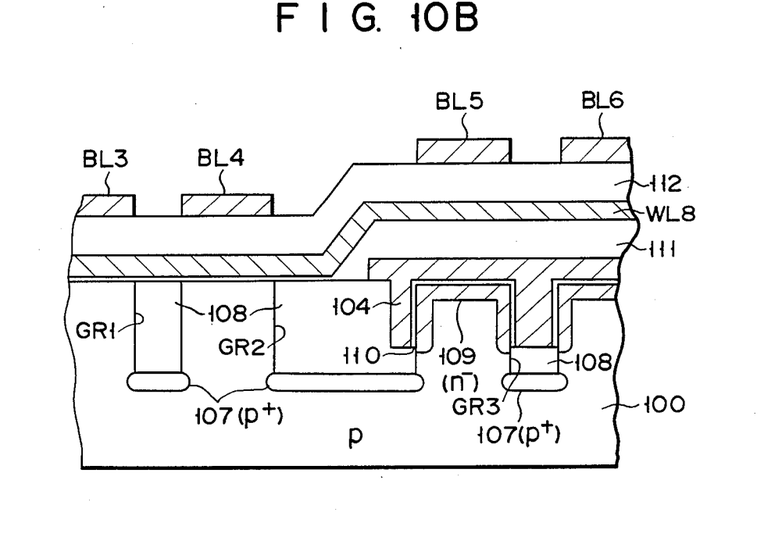

FIG. 10A shows a plane pattern of a semiconductor memory device according to another embodiment of the invention. FIG. 10B schematically shows a cross sectional view taken along the E—E line in FIG. 10A. Word lines WL$_1$, WL$_2$, . . . , WL$_8$ are vertically arranged over semiconductor substrate 100 of, e.g., p-type silicon. Bit lines BL$_1$ to BL$_8$ are horizontally arranged over those word lines. MOS transistors formed in memory cell regions 102 surrounded by thick solid lines are respectively arranged at the positions corresponding to the crossing points between each of word lines WL$_1$, WL$_4$, WL$_5$, and WL$_8$ and bit lines BL$_1$ to BL$_4$ and the crossing points between each of word lines WL$_2$, WL$_3$, WL$_6$, and WL$_7$ and bit lines BL$_5$ to BL$_8$. In addition, MOS capacitors formed in capacitor areas 103 in the hatched regions surrounded by dash-and-dot lines are respectively arranged at the positions corresponding to the crossing points between each of word lines WL$_2$, WL$_3$, WL$_6$, and WL$_7$ and bit lines BL$_1$, BL$_2$, BL$_3$, and BL$_4$ and the crossing points between each of word lines WL$_1$, WL$_4$, WL$_5$, and WL$_8$ and bit lines BL$_5$ to BL$_8$. Capacitor area 103 is covered by a capacitor electrode 104. On the other hand, the source region of each MOS transistor is connected to the adjacent MOS capacitor. The drain region of each MOS transistor is connected to corresponding one of bit lines BL$_1$ to BL$_8$ through contact hole 105. Grooves GR$_1$ to GR$_3$ are also formed in semiconductor substrate 100. p$^+$-type impurity regions 107 are formed under the bottom surfaces of grooves GR$_1$ to GR$_3$, respectively. Oxide layers 108 are deposited in grooves GR$_1$ to GR$_3$. The convex regions sandwiched by grooves GR$_1$ to GR$_3$ correspond to memory cell areas 102 surrounded by the thick solid lines in FIG. 10A. MOS transistors (not shown) each using word line WL$_8$ as a gate electrode are formed in the upper surface of the convex regions at the positions corresponding to the crossing points between, for instance, word line WL$_8$ and bit lines BL$_3$ and BL$_4$ in memory cell region 102. The crossing regions between word line WL$_8$ and bit lines BL$_5$ and BL$_6$ correspond to capacitor regions 103 of the hatched regions surrounded by dash-and-dot lines in FIG. 10A. Electrodes 104 for the MOS capacitors are formed in the upper and side surfaces of the convex regions in capacitor regions 103, respectively. Namely, the MOS capacitor is formed by n$^-$-type impurity the region 109 formed in the upper and side surfaces of the convex region of semiconductor substrate 100, an oxide layer 110 formed on n$^-$-type impurity region 109, and capacitor electrode 104 of polycrystalline silicon formed on oxide layer 110. Thus, polycrystalline silicon serving as capacitor electrode 104 is deposited in groove GR$_3$ in capacitor region 103. Insulation layers 111 and 112 are respectively formed between capacitor electrode 104 and word lines WL$_1$ to WL$_8$ and between word lines WL$_1$ to WL$_8$ and bit lines BL$_1$ to BL$_8$.

For example, in the case of groove GR$_2$ formed in the memory cell isolation region between bit lines BL$_4$ and BL$_5$, part of capacitor electrode 104 of MOS capacitor 103 is formed in the side surface of groove GR$_2$ on the side of capacitor region 103. The width of groove GR$_1$ in the memory cell isolation region between, e.g., bit lines BL$_3$ and BL$_4$ and the width of groove GR$_3$ in the memory cell isolation region between, e.g., bit lines BL$_5$ and BL$_6$ are respectively 0.8 $\mu$m. In contrast, groove GR$_2$ in the memory cell isolation region has the wide width of 1.6 $\mu$m as compared with the widths of grooves GR$_1$ and GR$_3$.

Figure 11:
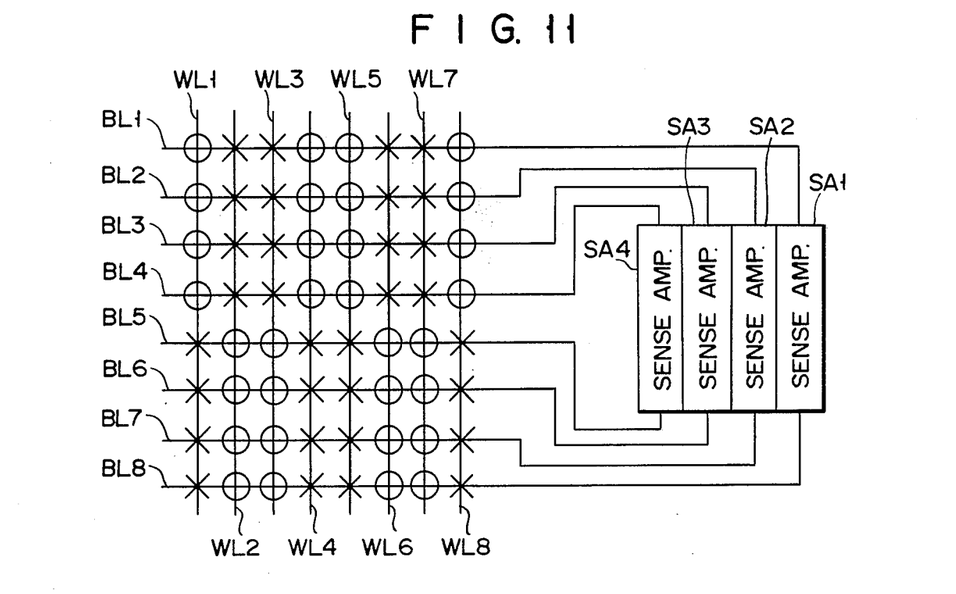
FIG. 11 shows the positional and connection relations between the memory cells in the memory device shown in FIGS. 10A and 10B and the sense amplifiers of the bit lines.

FIG. 11 shows the connection between bit lines BL$_1$ to BL$_8$ and sense amplifiers SA$_1$ to SA$_4$. In FIG. 11, marks o denote the positions where the MOS transistors are arranged and marks $\times$ represent the positions where the MOS capacitors are arranged. Bit lines BL$_1$ to BL$_8$ for transferring data signals of the memory cells are arranged in this sequence. The MOS transistor for charging or discharging charges into or from the MOS capacitors are connected to corresponding one of bit lines BL$_1$ to BL$_8$ at the crossing points between each of word lines WL$_1$, WL$_4$, WL$_5$, and WL$_8$ and bit lines BL$_1$ to BL$_4$ and the crossing points between each of word lines WL$_2$, WL$_3$, WL$_6$, and WL$_7$ and bit lines BL$_5$ to BL$_8$. For example, when word line WL$_4$ is selected, the information of four memory cells connected respectively to bit lines BL$_1$ to BL$_4$ is read out. This information is supplied to sense amplifiers SA$_1$ to SA$_4$ through each pair of bit lines BL$_1$ and BL$_8$, BL$_2$ and BL$_7$, BL$_3$ and BL$_6$, and BL$_4$ and BL$_5$, respectively, and detected.

As described above, according to the embodiment, the MOS transistors and MOS capacitors of the memory cells formed under bit lines BL$_1$ to BL$_4$ of the first to fourth columns are mutually positioned so as to be respectively arranged substantially in a line in the memory cell group including bit lines BL$_1$ to BL$_8$ of eight columns. In addition, the MOS transistors and MOS capacitors of the memory cells formed below bit lines BL$_5$ to BL$_8$ of the fifth to eighth columns are also positioned so as to be respectively arranged substantially in a line. The MOS transistors and MOS capacitors of the memory cells below bit line BL$_4$ of the fourth column are displaced in a direction of the bit line from the MOS transistors and MOS capacitors of the memory cells below bit line BL$_5$ of the fifth column. Consequently, the leak path may be formed due to the parasitic transistor which has already been described with reference to FIG. 5 with respect to only groove GR$_2$ between bit lines BL$_4$ and BL$_5$ among the grooves formed in the memory cell isolation region between the adjacent bit lines. To prevent the formation of the leak path due to the parasitic transistor, it is only necessary to form wide groove GR₂ between bit lines BL₄ and BL₅. The widths of the other grooves can be narrowed to the limited values in patterning. That is, in the case of manufacturing the semiconductor memory device using the 0.8 μm rule, the grooves between the bit lines of two adjacent columns of bit lines BL₁ to BL₈ are all formed so as to have the width of 0.8 μm except groove GR2 which is formed between bit lines BL4 and BL5 to have the width of 1.6 μm. When considering that the width of the groove between the adjacent memory cell groups is 0.8 μm, the sum of widths of the grooves in one memory cell group including eight bit lines BL1 to BL8 becomes $$0.8 \ \mu m \times 7 + 1.6 \ \mu m = 7.2 \ \mu m$$

Thus, the average groove width per memory cell becomes $$7.2 \ \mu m/8 = 0.9 \ \mu m$$

This means that the average groove width per memory cell is reduced by 0.7 μm as compared with the groove width of 1.6 μm of the conventional memory cells. Therefore, in a case where a DRAM of 4 kbits composed of 2048×2048 memory cells is formed, the chip width can be reduced by $$0.7 \ \mu m \times 2048 = 1.4 \ mm$$

In this manner, a degree of integration can be improved without increasing the chip size.

This effect is enhanced with an increase in number of bit lines which belong to one memory cell group. Also, this effect becomes remarkable as the total number of bit lines increases, namely, as a degree of integration of the memory cells increases. Further, as a degree of fine working accuracy to form the grooves is improved, the further excellent effect is presented.

In addition, according to the embodiment, in the PEP process to expose the upper surface of the convex region of memory cell region 102 except the capacitor region 103 after insulation layer 111 between layers was formed over capacitor electrode 104, the positioning of the mask for patterning is simplified. At the same time, the number of portions which needs the positioning allowance which is twice as large as the maximum allowable error in mask positioning is reduced. Namely, in the conventional semiconductor memory device, the mask positioning is needed for all grooves, so that the positioning allowance is necessary for each groove and the width of memory cell needs to be widened by the amount of the positioning allowance. However, according to the embodiment, it is only one portion in each memory cell group that needs the positioning allowance. Therefore, the mask positioning allowance width of the whole chip is reduced to ⅛ and the chip width can be decreased accordingly. As described above, the degree of integration and yield can be improved without increasing the chip size. This effect is enhanced with an increase in number of columns of the bit lines which belong to each memory cell group and becomes remarkable as the degree of integration of the memory cells increases.

Further, according to the embodiment, the layout of sense amplifiers SA becomes easy. Namely, in the conventional semiconductor memory device, each pair of bit lines BL and $\overline{BL}$ are formed in a line, each sense amplifier SA can be arranged between paired bit lines, and the memory cells can be arranged in a manner similar to the embodiment. However, in this case, sense amplifier SA has a larger occupied area than that of the memory cell and a complicated circuit arrangement is needed. Therefore, when considering the pitch of the bit lines, it is actually difficult to realize the foregoing layout of sense amplifiers SA. In this embodiment, the distance which is almost twice as long as the pitch of the bit lines can be used to form the sense amplifiers, so that the sense amplifiers can be easily arranged.

Figure 12:
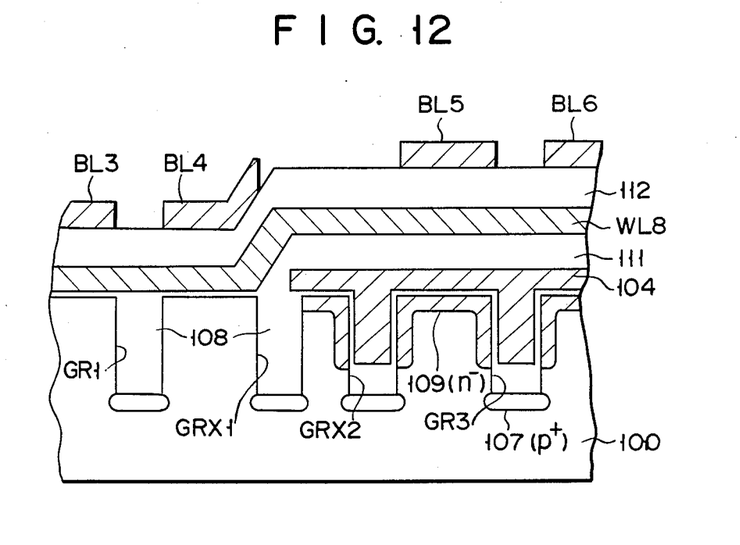
FIG. 12 shows an example of modification of the memory device shown in FIG. 10B.

In addition, in the embodiment, as shown in FIG. 10B, groove GR₂ having the sufficiently large width of 1.6 μm has been formed between bit lines BL, and BL₅ to prevent the occurrence of leak path due to the parasitic transistor. However, in place of groove GR₂, grooves of a plurality of columns, for example, two grooves GRX₁ and GRX₂ may be formed between bit lines BL₄ and BL₅ as shown in FIG. 12. In this case, grooves GRX₁ and GRX₂ are formed narrower than groove GR₂. Since groove GR₂ is widely formed, there is a problem that oxide layer 108 cannot be filled in the whole portion of groove GR₂. By using grooves GRX₁ and GRX₂ having the properly selected widths, this problem can be solved.

Figure 13:
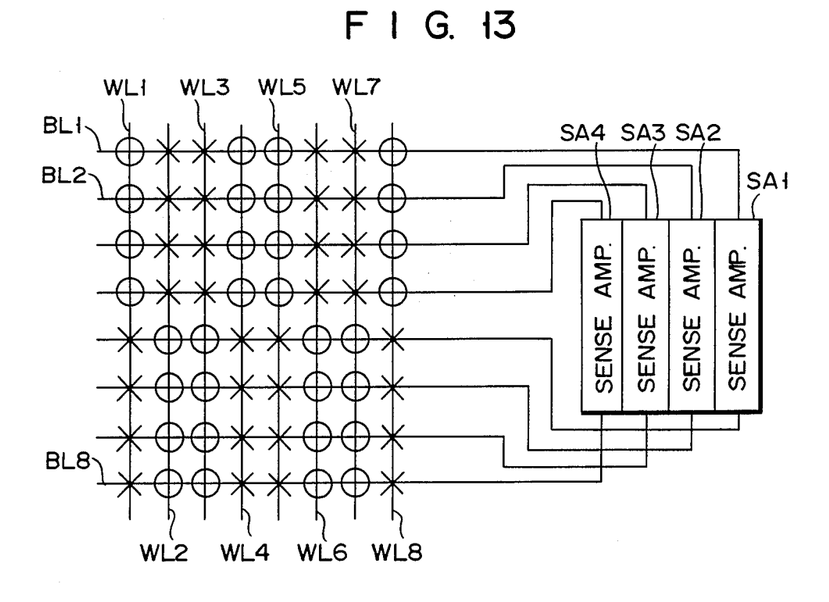
FIG. 13 shows an example of modification of the connection shown in FIG. 11.

Further, in the embodiment, the connection between bit lines BL₁ to BL₈ and sense amplifiers SA₁ to SA₄ as shown in FIG. 11 has been used. However, the connection between them is not limited to this connection. A pair of bit lines may be constituted by selected one of bit lines BL₁ to BL₄ and selected one of bit lines BL₅ to BL₈ and this pair of bit lines may be connected to one of sense amplifiers SA₁ to SA₄. For example, as shown in FIG. 13, each pair of bit lines BL₁ and BL₅; BL₂ and BL₆; BL₃ and BL₇; and BL₄ and BL₈ may be connected to sense amplifiers SA₁ to SA₄, respectively.

Further, in the embodiment, the case where four pairs of bit lines BL₁ to BL₈ were provided for each memory cell group has been described. However, the number of pairs of bit lines is not limited to four but it is sufficient to provide two or more pairs. Generally, the effect of the invention is enhanced with an increase in number of bit lines in each memory cell group.

Figure 14:
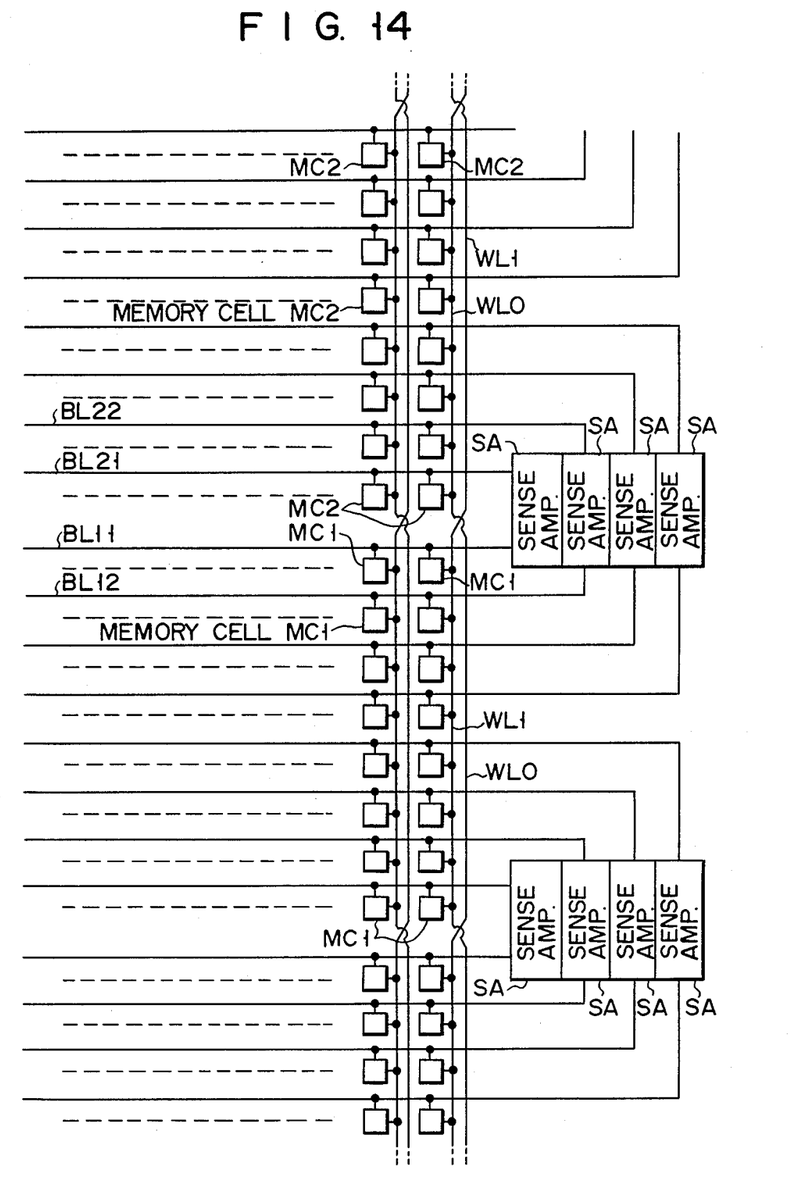
FIG. 14 shows an example of modification of the connection shown in FIG. 7.

Although the present invention has been described above with respect to the embodiments, the invention is not limited to only these embodiments. For instance, in the embodiment shown in FIGS. 7 and 8, four sense amplifiers SA which are connected to four pairs of bit lines from memory cell blocks MB₁ and MB₂ are arranged in a sense area in the direction perpendicular to the extending direction of each of bit lines BL₁₁, BL₁₂, BL₂₁, BL₂₂, etc. However, those four sense amplifiers SA may be arranged in the direction of bit lines BL₁₁, BL₁₂, etc. in sense areas as shown in FIG. 14 and the sense areas in which four sense amplifiers SA are formed may be arranged in the direction perpendicular to the extending direction of bit lines BL₁₁, BL₁₂, etc.

As described above, according to the present invention, there is provided a memory device having: a plurality of memory cells formed in the first memory cell area; sense amplifiers formed in the sense area; and a plurality of memory cells formed in the second memory cell area arranged on the same side as the first memory cell area with respect to the sense area. Thus, the memory cells such as vertical capacitor cell, folded capacitor cell, and the like which are suitable for realize high integration can be easily arranged with the folded bit line structure.

What is claimed is:

1. A dynamic semiconductor memory device comprising:
   a base surface having a sense area and first and second memory cell areas diposed adjacent to each other, each said first and second memory cell areas being adjacent said sense area at one side thereof;
   $2^N$ sense amplifiers, N being an integer greater than one (1), disposed within said sense area, each of said amplifiers including a first input terminal and a second input terminal for receiving input signals, each said sense amplifier generating an output signal responsive to said input signals received at said first and second input terminals;
   a plurality of first memory cells arranged in a plurality of rows and columns in said first memory area;
   a plurality of second memory cells arranged in a plurality of rows and columns in said second memory cell area;
   $2^N$ first bit lines, N being said integer greater than one (1), each of said bit lines being commonly connected to one of said plurality of columns of said first memory cells and connected to said first input terminal of one of said sense amplifiers;
   $2^N$ second bit lines, N being said integer greater than one (1), each of said bit lines being commonly connected to one of said plurality of columns of said second memory cells and connected to said second input terminal of one of said sense amplifiers;
   a plurality of first word lines, each of said first word lines being connected to one of said plurality of rows of said first memory cells; and
   a plurality of second word lines, each of said second word lines being connected to one of said plurality of rows of said second memory cells.

2. The dynamic semiconductor memory device of claim 1, wherein each of said memory cells comprises a vertical capacitor cell having a MOS transistor and a vertical capacitor connected to said MOS transistor.

3. The semiconductor memory device of claim 2, wherein each of said plurality of first word lines comprises a first conductive strip portion connected to said one of said plurality of rows of said first memory cells, and a second conductive strip portion connected to and extending longitudinally from said first conductive strip portion, and
   wherein each of said plurality of second word lines comprises a third conductive strip portion overlaying said first conductive strip portion, said first and third conductive strip portions being electrically insulated from each other, and a fourth conductive strip portion connected to and extending longitudinally from said third conductive strip portion, said fourth conductive strip portion being connected to said one of said plurality of rows of said second memory cells and underlying said second conductive strip portion, said second and fourth conductive strip portions being electrically insulated from each other.

4. The dynamic semiconductor memory device of claim 3, wherein said first and fourth conductive strip portions are disposed substantially in a first plane and said second and third conductive strip portions are metal portions disposed substantially in a second plane.

5. The semiconductor memory device of claim 4 wherein each of said rows of first memory cells is adjacent to and arranged longitudinally with one of said rows of second memory cells.

6. The dynamic semiconductor memory device of claim 1, wherein said first and second bit lines are spacedly disposed is said memory cell area, for providing an isolation region therebetween, said isolation region having an isolation groove of a predetermined width on said base surface, and wherein each of said memory cells is comprised of a folded capacitor cell including a capacitor having an electrode partly disposed in said isolation groove and a MOS transistor connected to said capacitor.

7. The dynamic semiconductor memory device of claim 6, wherein the first and second memory cell areas are spaced with a cell area groove therebetween wider than grooves extending in parallel with said bit lines formed in said first and second memory areas is formed between the first and second memory cell areas, said cell area groove having a width greater than said predetermined width of said isolated groove.

8. The dynamic semiconductor memory device of claim 6, wherein each of said first and second memory cell areas include a plurality of bit line grooves extending substantially in parallel with said bit lines in said base surface and between said first and second bit lines.

9. The dynamic semiconductor memory device of claim 1, wherein each of said memory cells is comprised of a corrugated memory cell.

10. The dynamic semiconductor memory device of claim 1, wherein said 2N sense amplifiers are arranged in a direction parallel with said first and second bit lines.

* * * * *